United States Patent [19]

Sasaki et al.

[11] Patent Number: 5,111,258
[45] Date of Patent: May 5, 1992

[54] SEMICONDUCTOR DEVICE WITH A MULTI-STEPPED SOURCE REGION AND METHOD FOR PRODUCING THE SAME

[75] Inventors: Mutsumi Sasaki, Machida; Koji Takahashi, Kamakura; Shuichi Suzuki, Kawasaki, all of Japan

[73] Assignee: Fujitsu Limited, Kawasaki, Japan

[21] Appl. No.: 742,081

[22] Filed: Jul. 31, 1991

Related U.S. Application Data

[63] Continuation of Ser. No. 493,013, Mar. 13, 1990, abandoned.

Foreign Application Priority Data

Mar. 14, 1989 [JP] Japan ............................ 1-61543

[51] Int. Cl.$^5$ ............................................ H01L 29/78
[52] U.S. Cl. .................................. 357/23.4; 357/23.3
[58] Field of Search .................. 357/23.4, 23.3, 23.1, 357/23.4

[56] References Cited

U.S. PATENT DOCUMENTS 4,433,468 2/1984 Kawamata ..................... 357/23.1

FOREIGN PATENT DOCUMENTS

| 0336393 | 10/1989 | European Pat. Off. .......... 357/23.4 |
| 58-100460 | 6/1983 | Japan ............................... 357/23.4 |
| 58-175872 | 10/1983 | Japan ............................... 357/23.4 |
| 2-143566 | 6/1990 | Japan ............................... 357/23.4 |

Primary Examiner—William D. Larkins
Assistant Examiner—Stephen D. Meier
Attorney, Agent, or Firm—Armstrong, Nikaido, Marmelstein, Kubovcik & Murray

[57] ABSTRACT

A semiconductor device includes a first region, a well-shaped second region formed in the first region and a third region formed in the well-shaped second region. Both the first region and the third region have a first conductive type, the well-shaped second region has a second conductive type. A gate electrode is formed on a channel of the well-shaped second region. The channel is sandwiched between the first region and the third region. According to the present invention, the depth of the third region is very deep in a portion near the channel and is very shallow in a portion far from the channel. A resistance of the well-shaped second region near a portion of the third region far from the channel is lower than near the portion of the third region near the channel.

11 Claims, 6 Drawing Sheets

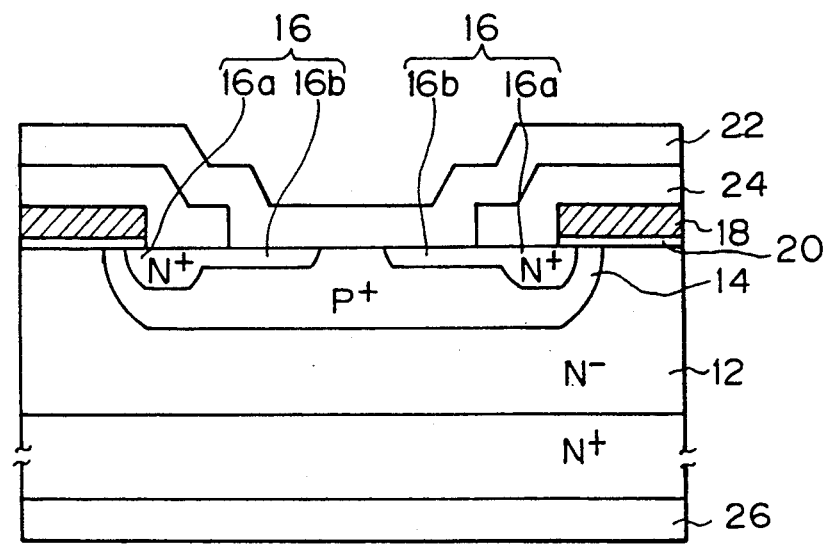
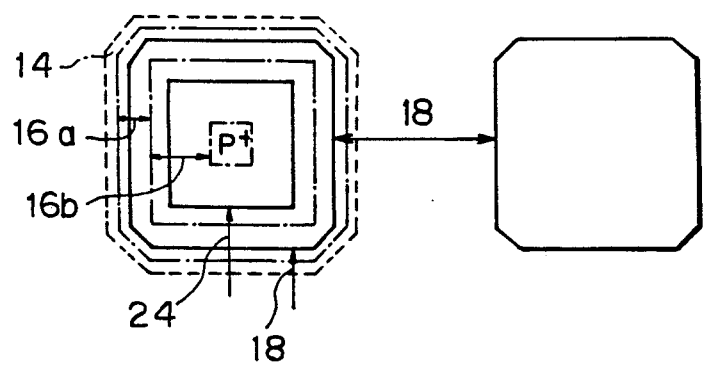

SEMICONDUCTOR DEVICE WITH A MULTI-STEPPED SOURCE REGION AND METHOD FOR PRODUCING THE SAME

This application is a continuation of application Ser. No. 493,013 filed Mar. 13, 1990 now abandoned.

BACKGROUND OF THE INVENTION

1. Field of the Invention

The present invention relates to a semiconductor device and a method for producing the same, and more particularly, to a vertical MOS transistor wherein the effects of a parasitic bipolar transistor are reduced and a method therefor.

2. Description of the Related Art

FIG. 1 shows a cross-sectional view of a conventional vertical MOS FET.

As shown in FIG. 1, an $n^-$ epitaxial layer 12 is formed, as a drain region, on a semiconductor substrate 10, and a well-shaped $p^+$ region 14 is formed on the $n^-$ epitaxial layer 12. A square shaped $n^-$ region 16 is formed in the $p^+$ region 14, as a source region and gate electrodes 18 having a square shape are formed on a gate oxide film 20 on the $p^+$ region 14.

Then a source electrode 22 is formed inside the gate electrode 18 so that it is brought into contact with a source region 16.

The source electrode 22 and the gate electrode 18 are insulated by a PSG film 24, and a drain electrode 26 is formed on a back side of the semiconductor substrate 10.

When the resistance R in the $p^+$ region 14 under the source region 16 is large in the vertical MOS FET, a parasitic bipolar transistor is generated around the channel region of the vertical MOS FET during a high voltage operation, and thus the MOS FET is destroyed.

Namely, when a junction between a $n^-$ region 12 and a $p^+$ region 14 is broken down during a high voltage operation, a voltage of a resistance R due to a break down current occurs in an npn parasitic bipolar transistor consisting of an emitter $n^+$ region 16, a base $p^+$ region 14, and a collector $n^-$ region with the result that a current flows between the emitter and the base is concentrated, due to the generation by a forward bias, and thus the transistor is destroyed.

To solve the above problems, a diffusion depth of the center portion of the $p+$ region 14 is increased, and at the same time, the $n+$ source region 16 is made shallower so that the area of the $p+$ region is enlarged, or the impurity concentration of the center portion of the $p+$ region is increased so that a resistivity value is lowered (Japanese Unexamined Patent Publication (Kokai) No. 60-196975). Namely, the value of the resistance in the $p+$ region 14 is lowered.

Therefore, to increase the diffusion depth of the center portion of the $p+$ region 14 and to increase the impurity concentration so as to lower the resistance R, a well shaped $p+$ region is formed, and impurities must be implanted at the center portion of the $p+$ region.

In this case, however, the impurities implanted at the center portion are diffused in the channel under the gate electrode 18, and therefore, it becomes difficult to control the impurity concentration in the channel, and thus deviations in the properties of the MOS FET are generated.

SUMMARY OF THE INVENTION

An object of the present invention is to provide a semiconductor device wherein a parasitic bipolar transistor is not operated when a breakdown current flows.

Accordingly there is provided a semiconductor device comprising a first region, a well-shaped second region formed in the first region, and a third region formed in the well-shaped second region, both the first region and the third region having a first conductive type, the well-shaped second region having a second conductive type and a gate electrode being formed on a channel of the well-shaped second region sandwiched between the first region and the third region.

The third region is formed deep at a portion near to the channel and is formed shallow at a portion far from the channel, and a resistance of the well-shaped second region near a portion of the third region far from the channel becomes lower.

According to the present invention, there is further provided a method of producing a semiconductor device, comprising the steps of:

forming a first region having a first conductive type on a semiconductor substrate, forming a patterned gate electrode on the first region through a gate insulating film, forming a well-shaped second region having a second conductive type in the first region, using the gate electrode as a mask, forming a third region having the first conductive type and a deep portion near a channel sandwiched between the first region and the third region and having a shallow portion far from the channel.

BRIEF DESCRIPTION OF THE DRAWINGS

FIGS. 3A to 3G are cross-sectional views explaining the production processes of the first example shown in FIG. 2;

FIGS. 4 is a top view for explaining the diffusion regions;

DESCRIPTION OF THE PREFERRED EMBODIMENTS

Figure 1:
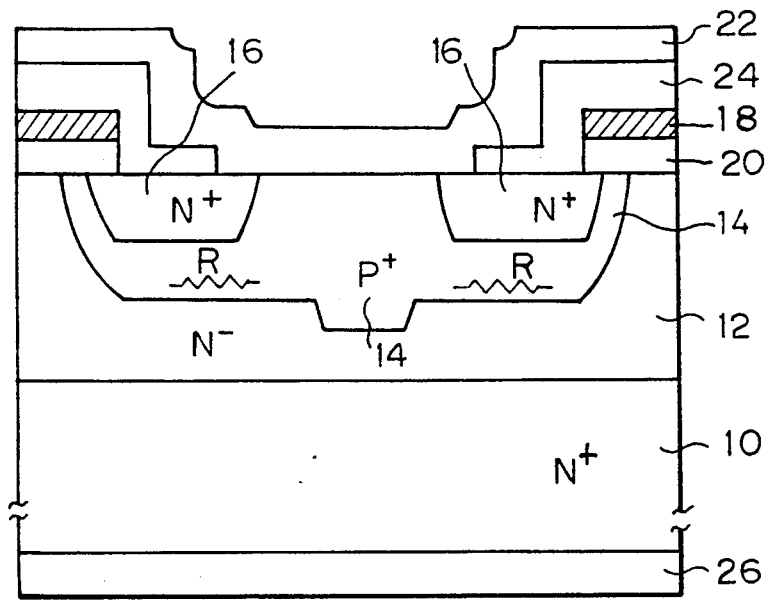
FIG. 1 is a cross-sectional view of a prior art vertical MOS FET.
Figure 2:
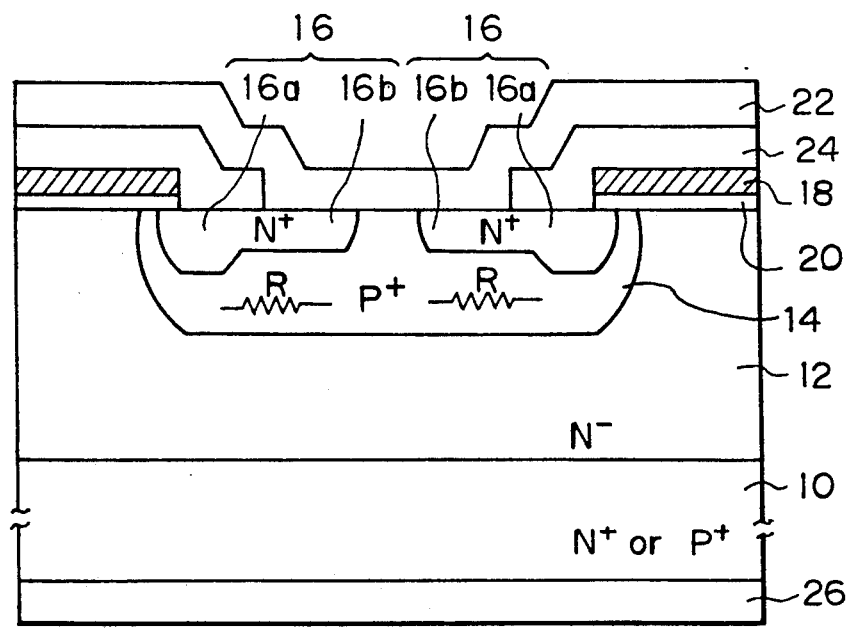
FIG. 2 is a cross-sectional view of a first example of a MOS FET according to the present invention.

FIG. 2 is a cross-sectional view of a first example of a semiconductor device according to a present invention. In FIG. 2 the same reference numbers denote the same elements shown in FIG. 1 of the prior art.

As shown in FIG. 2 a shape of an $n^+$ region 16 of a source region is different from that of the conventional vertical MOS FET shown in FIG. 1.

Namely, the $n^+$ region 16 has two regions; a deep region 16a formed near the channel under the gate electrode 18, and a shallow region 16b formed far from the channel.

Therefore, since the shallow region 16b is narrow, an area of a $p^+$ region 14 under the shallow region 16b becomes large, and accordingly, the resistance R becomes low. Therefore, the voltage difference of the resistance R due to a breakdown current becomes small, with the result that a voltage applied between the emitter and the base of an npn parasitic bipolar transistor consisting of an emitter n+ region 16, a base p+ region 14, and a collector n− region 12 becomes low, whereby the effects of the parasitic bipolar transistor are reduced and a destruction of the device is prevented.

According to the example shown in FIG. 2. Since a diffusion depth of the center portion of the p+ region 14 is not enlarged, a further implantation of impurities to obtain the high concentration thereof is not required. Accordingly, the impurity concentration in the channel is not varied and the resistance R is lowered, while maintaining the properties of the MOS FET at a constant level.

Furthermore, since the region 16a near the channel is deeply formed, the current flowing into the channel due to a voltage applied to the gate electrode 18 can be controlled so that the basic operation of the MOS FET is stabilized.

A method of producing the MOS FET shown in FIG. 2 will now be described with reference to FIGS. 3A to 3G.

Figure 3A:
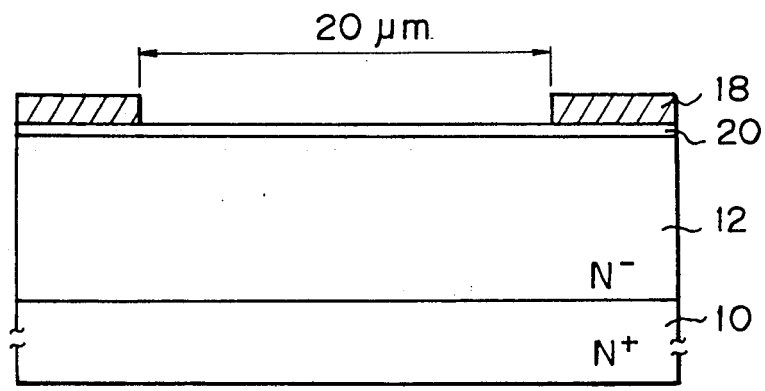

First, as shown in FIG. 3A, an n− epitaxial layer 12 having a thickness of 10 $\mu$m is formed on an n+ semiconductor substrate 10 having a thickness of 500 $\mu$m by a well-known epitaxial growth process. Then, by thermal oxidation, a gate oxide film 20 having a thickness of 600 Å, preferably from 400 to 1000 Å is formed on the surface of the n− epitaxially layer 12. Thereafter, square shaped polysilicon gate electrodes 18 having a thickness of 5000 Å, preferably from 4000 to 7000 Å is formed on the gate oxide film 20. The distance between the gate electrodes 18 to 20 $\mu$m.

Figure 3B:
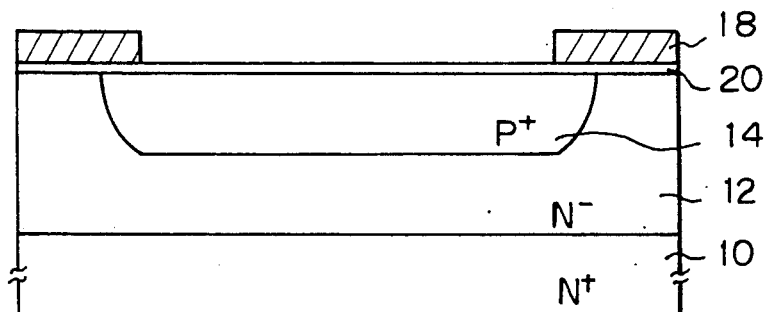

Then, as shown in FIG. 3B, boron (B) ions are introduced into the n− epitaxial layer 12 by an ion implantation (I.I) process, using the gate electrodes 18 as a mask. The I.I. conditions are as follows.

I.I. energy: 60 keV preferably from 30 to 150 keV
dosage: $5 \times 10^{13}/cm^2$ ($10^{13}$ to $5 \times 10^{14}/cm^2$)

Then annealing is carried out at about 1200° C. so that a well-shaped p+ channel region 14 having a thickness of 3 $\mu$m (preferably from 2 to 4 $\mu$m) and having a surface impurity concentration of $1 \times 10^{18}/cm^3$ (preferably from $10^{17}$ to $10^{19}/cm^3$) is formed.

Figure 3C:
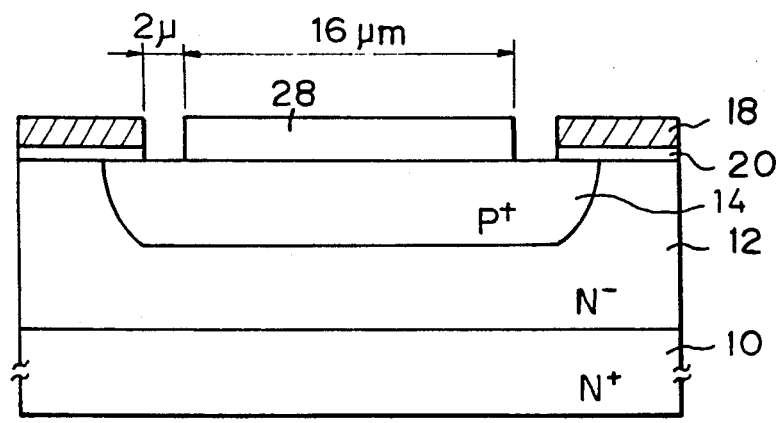
Figure 3D:
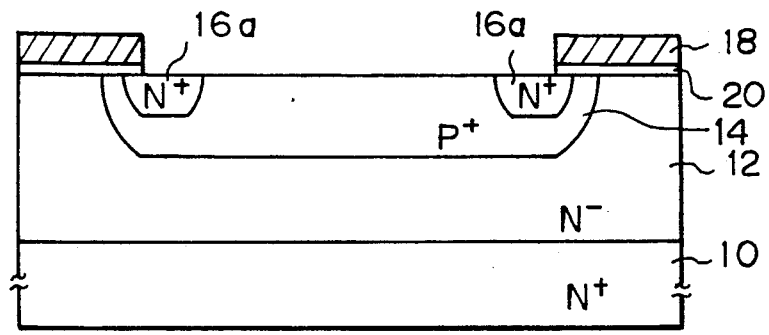

Therefore, as shown in FIG. 3C, an exposed gate oxide film 20 on the p+ channel region 14 is removed, and a patterned resist layer 28 is formed on the center portion of the surface of the p+ channel region 14, having a thickness of about 1 $\mu$m and a width of 16 $\mu$m. The distance between the resist layer 28 and the gate electrode 18 is 2 $\mu$m. Next, as shown in FIG. 3D, phosphorus (P) ions are introduced into the p+ channel region 14 by an I.I. process using the gate electrode 18 and the resist layer 28 as a mask. the conditions of the I.I process are as follows.

I.I. energy: 60 keV (preferably from 30 to 180 keV)
dosage: $8 \times 10^{15}/cm^2$ (preferably from $10^{15}$ to $10^{16}/cm^2$)

Then, annealing is carried out at about 1100° C., so that self-aligned deep n+ regions 16a having a thickness of 1.5 $\mu$m (preferably from 1 to 2 $\mu$m) and having a surface impurity concentration of $10^{20}/cm^3$ (preferably from $10^{19}$ to $10^{21}/cm^3$ is formed.

The diffusion depth of the n+ regions a 16a is such that a threshold voltage of about 1.5 V required in a channel portion formed under the gate electrodes 18 can be obtained.

Figure 3E:
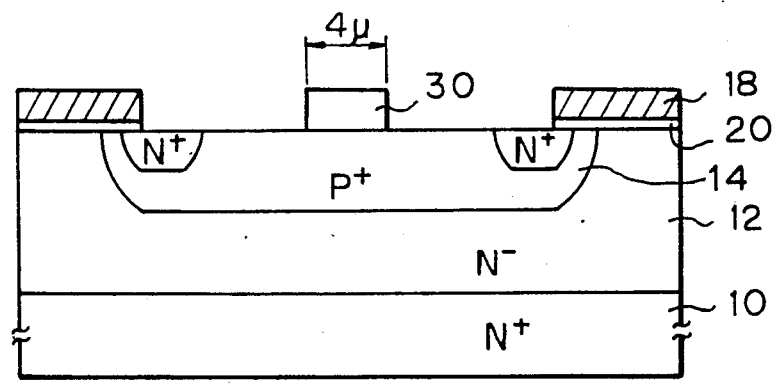

Then, as shown in FIG. 3E, a resist layer 30 having a width of 4 $\mu$m less than that of the resist layer 28 is formed.

Figure 3F:
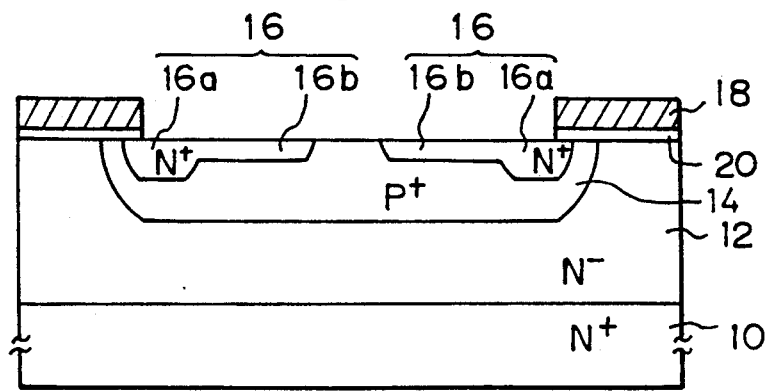

Thereafter, as shown in FIG. 3F, phosphorus ions are again introduced into the p+ channel region 14, using the gate electrode 18 and a small resist layer 30 as a mask. The conditions of the I.I. process are as follows.

I.I energy: 60 keV (preferably from 30 to 180 keV)
dosage: $8 \times 10^{15}/cm^2$ ($10^{15}$ to $10^{16}cm^2$)

Then, after removing the resist layer 30, annealing is carried out at about 1000° C., so that self-aligned shallow n+ regions 16b having a thickness of 0.7 $\mu$m (preferably 0.5 to 0.9 $\mu$m) and having a surface impurity concentration of $10^{20}/cm^3$ (preferably $10^{19}$ to $10^{21}/cm^3$) are formed.

The diffusion depth of the shallow n+ regions 16b is such that the shallow n+ regions 16b can be brought into contact with source electrodes 22, to be formed later, and on the other hand, a large depth of the p+ channel region 14 under the n+ regions 16b is maintained to lower the resistance R.

Then as shown in FIG. 3G, a PSG (Phospho Silicate Glass) film 24 having a thickness of 1 $\mu$m is formed on the entire surface, by a CVD process, and thereafter, a contact hole, to establish contact with the n+ regions 16 (16a, 16b), is provided in the PSG film 24 and aluminum is deposited on the entire surface and etched to a desired shape, to form a source electrode 22. Finally, a drain electrode 26 is formed on the under layer of the semiconductor substrate 10. Various modifications of the present invention can be made.

For example, although the above-described example relates to an n channel MOS FET, an opposite conductive type, i.e., p channel MOS FET, also can be used.

Figure 5:
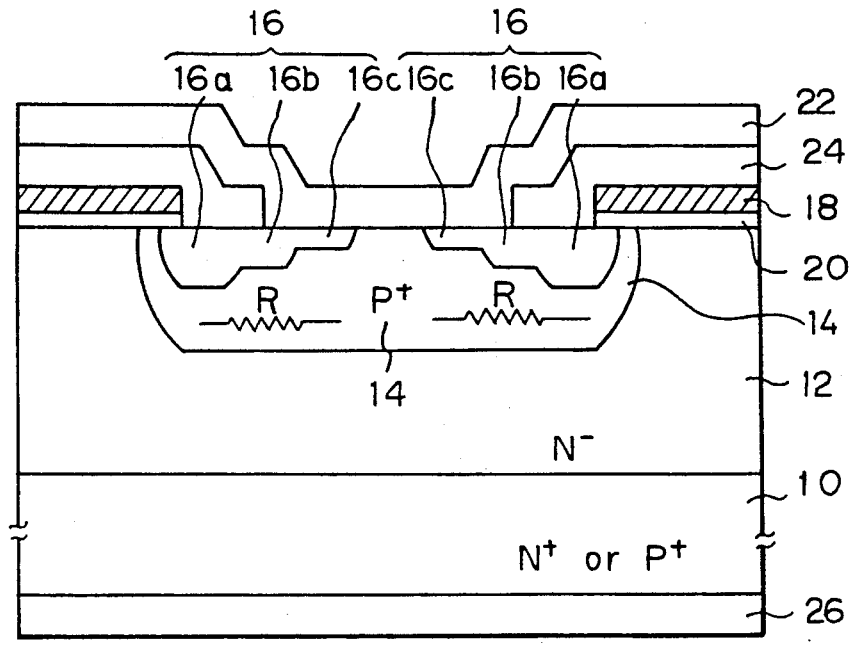
FIG. 5 is a cross-sectional view of a second example according to the present invention, wherein three-step diffusion regions are formed.
Figure 6:
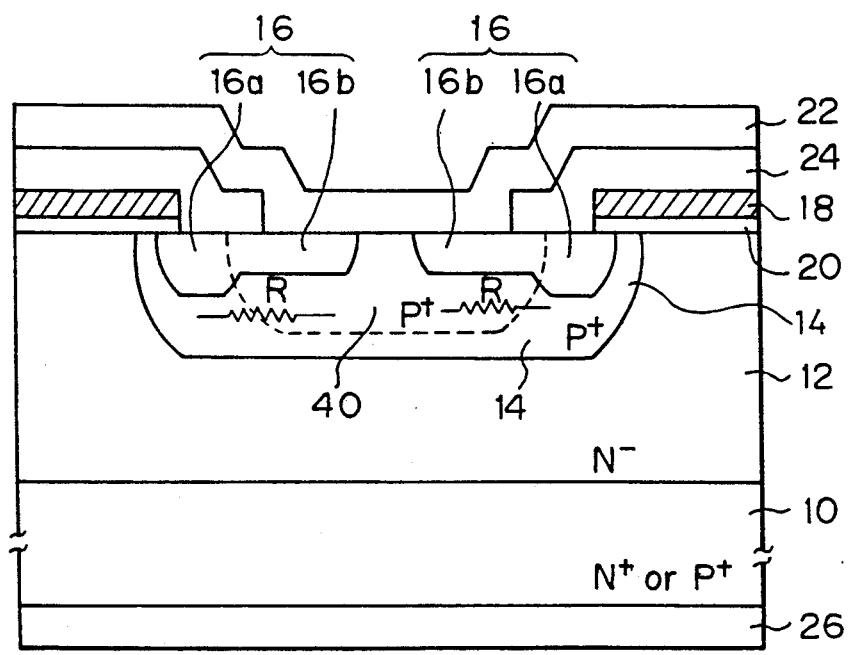
FIG. 6 is a cross-sectional view of a third example according to the present invention.
Figure 7A:
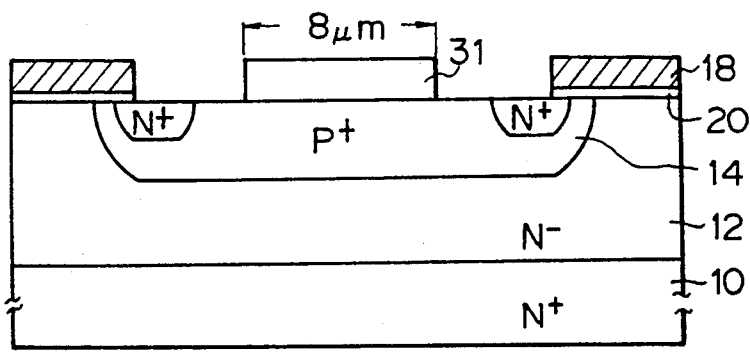
FIGS. 7A to 7D are cross-sectional views for explaining the production processes of the second example.
Figure 7B:
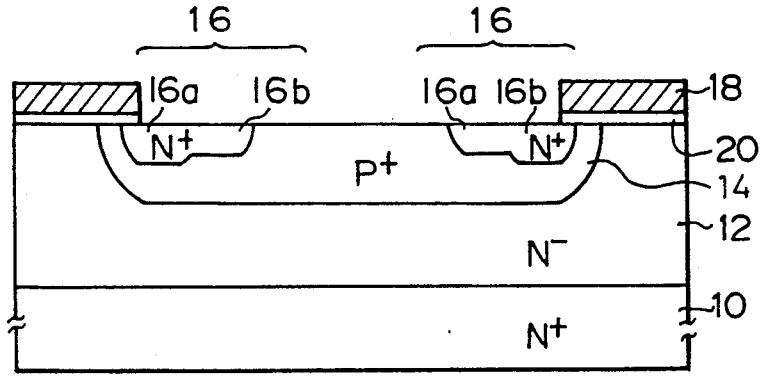
Figure 7C:
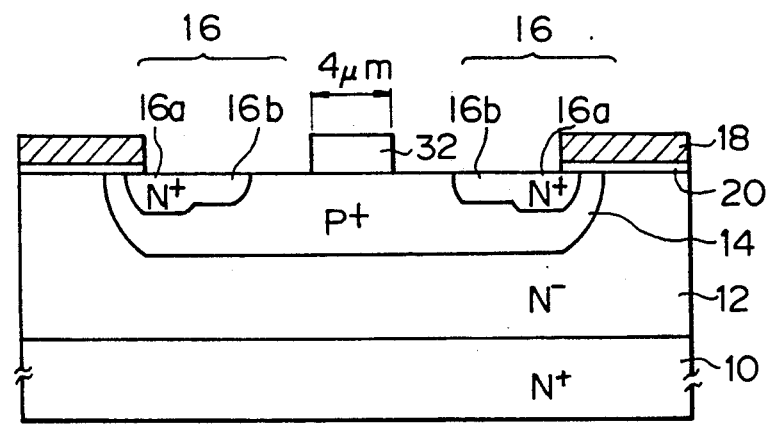
Figure 7D:
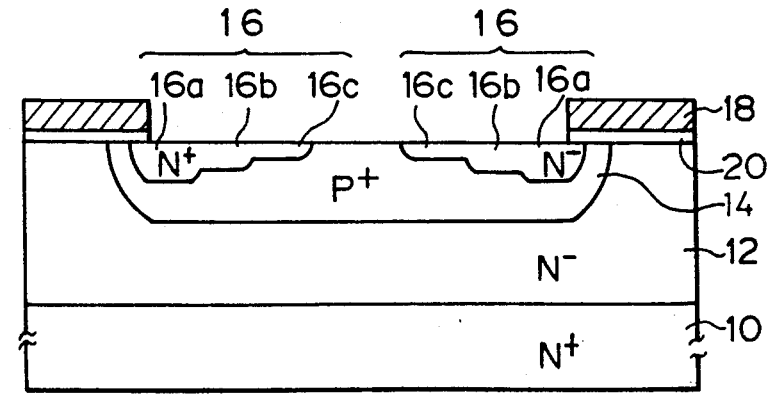

FIG. 5 and 6 show other examples according to the present invention.

Particularly, FIG. 5 is a cross-sectional view of a second example wherein additional shallow n+ regions 16c to the structure of FIG. 2 are formed in the p+ channel region.

The structure of FIG. 5 is produced by substantially the same processes as explained in FIGS. 3A to 3G, except that an additional shallow n+ region is formed in the p+ channel region 14.

Namely, after forming the structure of FIG. 3D, a resist layer 31 having a width of 8 $\mu$m less than that of the resist layer 28 is formed on the center portion of the surface of the p+ channel region 14, and thereafter phosphorus ions are introduced into the p+ channel region 14 under the same I.I. conditions as explained in FIG. 3F.

Then, after removing the resist layer 31, annealing is carried out so that a self-aligned shallow n+ region 16b having a thickness of 1 $\mu$m (0.8 to 1.2 $\mu$m) and a surface impurity concentration of $10^{20}/cm^3$ (preferably $10^{19}$ to $10^{21}/cm^3$) is formed.

Further, a resist layer 32 having a width of 4 $\mu$m less than that of the resist layer 31 is formed on the p+ channel region 14, and then phosphorus ions are also introduced into the p+ channel region 14 under the same I.I conditions as explained in FIG. 3F.

Then, after removing the resist layer 32, annealing is carried out so that a self-aligned shallow n+ regions 16c having a thickness of 0.5 $\mu$m (0.3 to 0.7 $\mu$m) and a surface impurity concentration of $10^{20}/cm^3$ (preferably $10^{19}$ to $10^{21}/cm^3$) is formed, and the same process as shown in FIG. 3G is carried out so that the structure of FIG. 5 is obtained. In the structure of FIG. 5, a larger depth of the p+ channel region 14 under the n+ regions 16c is maintained, and thus the resistance R is preferably lowered.

FIG. 6 is a cross-sectional view of third example, wherein an additional p+ channel region 40 is formed in the p+ channel region 14. The p+ channel region 14 is formed by the I.I. process and annealing after obtaining the structure of FIG. 3F.

According to the structure of FIG. 6 a resistance R in the additional p+ channel region 40 can be preferably lowered.

Although the structures of the examples explained above 1 are vertical MOS FETs, a vertical insulating gate bipolar transistor having substantially the same structure as the MOS FET, i.e., an emitter region of the n+ region 16, a collector region of the n− region 12, and an n+ semiconductor substrate 10, an emitter electrode of the source 22, and a collector electrode of the drain electrode 26, can be used.

According to the present invention, since the source region is formed to a large depth in a portion near the channel and to a shallow depth in a portion far from the channel, the resistance of a second conductive type region under the source region is lowered. Therefore, when a breakdown current flows a parasitic bipolar transistor is not operated, and thus a destruction of a device does not occur.

We claim:

1. A vertical MOS transistor comprising:
   a first region;
   a well-shaped second region formed in said first region, said well-shaped second region having a center portion and a channel formed in a periphery of the second region;
   a third region formed in said well-shaped second region between said center portion and said channel, both said first region and said third region having a first conductive type, said well-shaped second region having a second conductive type opposite to said first conductivity type; and
   a gate electrode being formed above said channel of said well-shaped second region through a gate insulating film, said channel sandwiched between said first region and said third region, said third region having a first portion formed near said channel and a second portion formed far from said channel, said first portion having a depth inside said second region which is very deep and said second portion having a depth which is very shallow, wherein a resistance of said well-shaped second region near said second portion of said third region is lower than said first portion.

2. A vertical MOS transistor according to claim 1, wherein said first region consists of an n− region.

3. A vertical MOS transistor according to claim 1, wherein said well-shaped second region consists of a p+ region.

4. A vertical MOS transistor according to claim 1, wherein said third region consists of an n+ region.

5. A vertical MOS transistor according to claim 1, wherein said first and second portions of said third region forms two steps.

6. A vertical MOS transistor according to claim 5, wherein said depth of said first portion is from 1 to 2 μm and said depth of said second portion is from 0.5 to 0.9 μm.

7. A vertical MOS transistor according to claim 6, wherein said depth of said first portion is 1.5 μm and said depth of said second portion is 0.7 μ.

8. A vertical MOS transistor according to claim 1, wherein said third region has a third portion wherein said first, second and third portions form three steps.

9. A vertical MOS transistor according to claim 8, wherein said depth of said first portion is from 1 to 2 μm, a depth of said third portion is from 0.8 to 1.2 μm, and the depth of said second portion is from 0.3 to 0.7 μm.

10. A vertical MOS transistor according to claim 9 wherein said depth of said first portion is 1.5 μm, said depth of said third portion is 1 μm, and said depth of said second portion is 0.5 μ.

11. A vertical MOS transistor according to claim 1, wherein said first, second and third regions and said gate electrode form a MOS FET.

* * * * *